(12) United States Patent
Lapin et al.

(10) Patent No.: US 6,251,557 B1
(45) Date of Patent: Jun. 26, 2001

(54) PHOTOSENSITIVE RESIN COMPOSITION FOR RAPID PROTOTYPING AND A PROCESS FOR THE MANUFACTURE OF 3-DIMENSIONAL OBJECTS

(75) Inventors: Stephen C. Lapin, Waterford, WI (US); Michael G. Sullivan, Elgin, IL (US)

(73) Assignee: DSM N.V., Heerlen (NL)

( * ) Notice: Subject to any disclaimer, the term of this patent is extended or adjusted under 35 U.S.C. 154(b) by 0 days.

(21) Appl. No.: 09/390,678

(22) Filed: Sep. 7, 1999

Related U.S. Application Data

(63) Continuation of application No. 08/855,720, filed on May 8, 1997, now abandoned.
(60) Provisional application No. 60/017,211, filed on May 9, 1996.

(51) Int. Cl.[7] .............................. G03F 7/20; G03F 7/028; G03F 7/26
(52) U.S. Cl. .................. 430/269; 430/280.1; 430/945; 522/170; 522/168; 522/175; 522/181; 264/401
(58) Field of Search ................................ 430/280.1, 269; 522/170, 168, 175, 181; 264/401

(56) References Cited

U.S. PATENT DOCUMENTS

| | | | |
|---|---|---|---|
| 4,575,330 | 3/1986 | Hull | 425/174.4 |
| 4,657,779 | 4/1987 | Gaske . | |
| 5,014,207 | 5/1991 | Lawton | 364/468 |
| 5,418,112 | 5/1995 | Mirle et al. | 430/269 |
| 5,434,196 | 7/1995 | Ohkawa et al. . | |
| 5,476,748 | 12/1995 | Steinmann et al. . | |
| 5,476,749 | 12/1995 | Steinmann et al. | 430/269 |
| 5,519,816 | 5/1996 | Pomerantz et al. | 395/119 |
| 5,573,889 | 11/1996 | Hofmann et al. | 430/269 |
| 5,707,780 | 1/1998 | Lawton et al. | 430/269 |

FOREIGN PATENT DOCUMENTS

| | | |
|---|---|---|
| 535 828 | 4/1993 | (EP) . |
| 605 361 | 7/1994 | (EP) . |
| 2 262 817 | 6/1993 | (GB) . |

OTHER PUBLICATIONS

RN 87211–27–6, Registry, online American Chemical Society, 1998.
RN 25085–98–7, Registry, online American Chemical Society, 1998.
RN 54735–63–6, Registry, online American Chemical Society, 1998.
RN 15625–89–5, Registry, online American Chemical Society, 1998.
J. Oldshue, AlChE Goes Metric, CEP, Aug. 1977, pp. 135–137 and page w/o No.
Robert C. Weast, ed. CRC Handbook of Chemistry and Physics, 52nd ed, The Chemical Rubber Co., Cleveland, OH, 1971, pp. F 34 and F 35.
Pelgrims, 107:238603, Chemical Abstract of Pigm. Resin. Technol. 1987, vol. 16, No. 9, pp. 9–8 from American Chemical Society.

*Primary Examiner*—Cynthia Hamilton
(74) *Attorney, Agent, or Firm*—Pillsbury Winthrop LLP

(57) ABSTRACT

The invention relates to a photosensitive resin composition for rapid prototyping comprising:

a. about 30 wt. % to about 70 wt. % of at least two epoxy resins, at least one of these resins is solid at room temperature and comprises aromatic groups, and at least one of these resins is liquid, having a viscosity at 25° C. lower than about 1,000 Pa.s, b. about 15 wt. % to about 50 wt. % of at least one multifunctional acrylate compound c. about 5 wt. % to about 30 wt. % of a hydroxyfunctional compound d. about 1 wt. % to about 6 wt. % cationic photoinitiator e. about 1 wt. % to about 6 wt. % free radical photoinitiator.

The invention further relates to a process for the manufacturing of 3-dimensional objects, known as rapid prototyping, wherein the photosensitive resin composition is used.

15 Claims, No Drawings

US 6,251,557 B1

PHOTOSENSITIVE RESIN COMPOSITION FOR RAPID PROTOTYPING AND A PROCESS FOR THE MANUFACTURE OF 3-DIMENSIONAL OBJECTS

This is a continuation of application Ser. No. 08/855,720, filed May 8, 1997 now abandoned, which claims the benefit of Provisional Application No. 60/017,211, filed May 9, 1996.

FIELD OF THE INVENTION

The present invention relates to a photosensitive resin composition for use in rapid prototyping, and in particular, a resin made from both a cationic curable epoxy resin system and a radical-curable acrylate system.

BACKGROUND OF THE INVENTION

Rapid prototyping with the use of a photosensitive or radiation-curable resin compositions involves curing of well-defined areas of resin layers on top of each other to make a three-dimensional object. This object can be used either as a prototype or for making a prototype. A prototype, or model, is often used in the early preparation stages of new product manufacture.

The radiation-curable or photosensitive resin used in a prototype process must conform to many criteria, which can be a difficult challenge to the formulator. For example, the resin composition before cure must have a suitable viscosity. During cure, the resin composition must cure rapidly with a good through cure. Moreover, a sufficiently thick layer should be cured, preferably with a relatively low light intensity irradiation. Also, the cured resin composition should have good green strength mechanical properties, good final mechanical properties, and a relatively low shrink factor on cure. Such combinations of properties are difficult to achieve.

In order to achieve this balance of properties, various resin compositions have been proposed. For example, according to U.S. Pat. No. 5,418,112, a suitable resin system consists of an acrylate oligomer, acrylate functional diluents and a specific photoinitiator system for radical generation. However, radical-curable resin systems tend to shrink too much during cure, thereby causing difficulties with precision.

Other proposed resin compositions are dual systems and comprise both epoxy functional compounds and acrylate functional compounds. Here, the acrylates are cured using a radical generating photoinitiator, and the epoxy using a cation generating photoinitiator. Examples of these resin compositions are described in, for example, EP-A-535,828, U.S. Pat. No. 5,434,196, and EP-A-605,361.

According to EP-A-535,828, a suitable resin composition consists of a bisphenol-A based acrylate, an acrylate functional diluent, a cycloaliphatic epoxy functional component, and a suitable initiator system which is sensitive to light with a wavelength between 400 and 600 nm. According to U.S. Pat. No. 5,434,196, the cationically curable epoxy resin should be used in combination with a vinyl-ether compound. According to EP-A-605,361, a suitable composition consists of an epoxy resin, a cycloaliphatic or aromatic di-acrylate and an hydroxy functional polyether, polyester or polyurethane. The hydroxy functional polymer does react with the epoxy resin. Although these resin compositions have some favorable characteristics, further improvements are needed particularly with respect viscosity, post-cure mechanical properties, and accuracy of prototype parts.

SUMMARY OF THE INVENTION

It is an object of the present invention to provide a photosensitive resin composition suitable for rapid prototyping which has a good balance of mechanical properties together with other good properties such as viscosity.

It is a further object of the invention to provide a resin composition comprising both an epoxy resin and an acrylate functional compound together with cationic and radical generating photoinitiators that has a good stability in that it does not show phase separation on UV-cure.

It is yet another object of the invention to provide such a resin composition with appropriate photoinitiators which show homogeneous cure with relative low intensity UV-light (on comparison with laser light), good through-cure in at least resin layers of more than 200 µm thickness, which cured resin exhibits good mechanical properties.

It is yet another object of the invention to provide a method for manufacturing 3-dimensional objects in which the resin composition according to the present invention is used.

The photosensitive resin composition according to the invention for use in rapid prototyping comprises a. about 30 wt. % to about 70 wt. % of at least two epoxy resins, wherein at least one of these resins is solid at room temperature and comprises aromatic groups, and at least one of these resins is liquid, having a viscosity at 25° C. lower than about 1,000 Pa.s, b. about 15 wt. % to about 50 wt. % of at least one multifunctional acrylate compound, c. about 5 wt. % to about 30 wt. % of a hydroxyfunctional compound, d. about 1 wt. % to about 6 wt. % cationic photoinitiator, e. about 1 wt. % to about 6 wt. % free radical photoinitiator.

Preferably, the amount of the solid epoxy resin(s) is about 10 wt. % to about 40 wt. %, and more preferably, about 15 wt. % to about 35 wt. %. Preferably, the amount of the liquid epoxy resin(s) is about 10 to about 40 wt. %.

The process of the present invention for the manufacturing of 3-dimensional objects comprises applying actinic radiation to a layer of photosensitive resin in order to cure a pre-determined well-defined area of the resin layer, which area forms a cross-section of the 3-dimensional form, introducing an uncured layer of resin on top of the cured layer and repeating the curing step, wherein the photosensitive resin composition comprises:

a. about 30 wt. % to about 70 wt. % of at least two epoxy resins, wherein at least one of these resins is solid at room temperature and comprises aromatic groups, and at least one of these resins is liquid, having a viscosity at 25° C. lower than about 1,000 Pa.s, b. about 15 wt. % to about 50 wt. % of at least one multifunctional acrylate compound, c. about 5 wt. % to about 30 wt. % of a hydroxyfunctional compound, d. about 1 wt. % to about 6 wt. % cationic photoinitiator, and e. about 1 wt. % to about 6 wt. % free radical photoinitiator.

The process of the present invention is advantageous in case the curing is performed with a laser, the laser is motion controlled with a computer, with the laser beam focused on a relatively tiny area of the pre-determined desired to-be-cured area, so as to have the laser scan over the to-be-cured area to at least substantially initiate the cure of the photosensitive resin composition. Presently preferred lasers are the helium/cadmium and the argon ion lasers.

Most preferred is a process which makes use of a photomask to define the to-be-cured area and in which the to-be-cured area is exposed to UV-light all at once.

DETAILED DESCRIPTION OF THE INVENTION

The first component of the resin composition according to the invention comprises at least two epoxy resins. One of these resins is solid at room temperature and comprises aromatic groups. The other resin is liquid, which means, throughout this specification, having a viscosity at 25° C. lower than about 1,000 Pa.s.

The solid epoxy resin generally is a substantially amorphous polymer, thus, such a resin has a melting range going from the solid to the liquid state.

The melting point of the solid resin preferably is higher than about 30° C. Solid epoxy resins with a melting point higher than about 40° C. are particularly preferred. Generally, these epoxy resins have a molecular weight (Mw) higher than about 600. Molecular weight, as used throughout this application, is the calculated molecular weight of the molecule concerned. In case of a polymer structure, it is the calculated molecular weight of the expected structure, based on the starting materials and reaction conditions. The molecular weight can also be determined using conventional techniques.

The liquid epoxy resin has a viscosity at 25° C. lower than about 1000 Pa.s, preferably lower than about 100 Pa.s. In general, the molecular weight of such a resin is lower than about 500.

The liquid epoxy resin can be aliphatic or aromatic. Preferably, the liquid epoxy resin comprises one or more cycloaliphatic groups, or comprises aromatic groups. Aliphatic epoxy resins give improved cure speed; aromatic epoxy resin results in better storage stability of the liquid resin. Both types of resins are very suitable as the liquid epoxy resin.

Examples of suitable solid or liquid epoxy resins with aromatic groups are phenol based resins such as epoxidized novolac resins and bisphenol based resins.

Such resins comprise one or more of the groups according to formula (1) or (2):

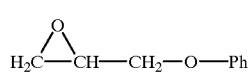

(1)

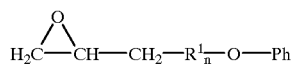

(2)

in which $R^1$ is an alkoxy group, Ph is a moiety comprising a phenyl ring, and n is an integer between 1 and about 12. Preferably, $R^1$ is an alkoxy with 2, 3 or 4 carbon atoms, in particular ethoxy or propoxy. Preferably, n is smaller than about 6, in particular, n is 1 or 2. Such epoxy resins are made by reaction of epichlorohydrin with the hydroxyl of the phenol or alkoxylated phenol group.

Particularly preferred are bisphenol resins such as bisphenol-A or bisphenol-F based epoxy resins. These type of resins are commercially available. Both liquid and solid bis-phenol based epoxy resins exist. Examples of suitable epoxy resins include EPON® resins from Shell such as EPON® 1001, 1002 and 1003. Analogous products exist e.g. from Dow Chemical as DER 661 and higher homologous. Other examples of suitable solids epoxy resins are the epoxy-novolac with about 6 phenol groups and an epoxy equivalent weight of about 200 (ERR 0100 from Union Carbide) and the polyglycidylether of o-(resol-formaldehyde)Novolac.

Examples of suitable aliphatic liquid epoxy resins include:

bis-4(4-hydroxycyclohexyl)-methane diglycidylether,
2,2-bis-4(4-hydroxycyclohexyl)-propane diglycidylether,
3,4-epoxycyclohexylmethyl-3,4-epoxycyclohexanecarboxylate,
bis-(2,3-epoxycyclopentyl)-ether,
vinylcyclohexanoxide,
dicyclopentadiene-dioxide,
ethylene-bis-(3,4-epoxycyclohexanecarboxylate),
bis(3,4-epoxycyclohexylmethyladipate),
vinylcyclohexenedioxide,
3,4-epoxy-6-methylcyclohexyl-3,4-epoxy-6-methyl-cyclohexane carboxylate,
dioctyl-epoxyhexahydrophthalate, and mixtures thereof.

Examples of suitable liquid epoxy resins are bisphenol-A, optionally with small amounts of higher polymer to prevent crystallization, having an epoxy equivalent weight between 170–200, such as DER 332, DER 330, DER 331 (Dow Chemical), and EPON 826 and EPON 828 (Shell). Other suitable liquid epoxy resins are Bisphenol-F (e.g. XD 7818 from DOW Chemical), the low molecular weight epoxy novolac resins. Further useful examples of epoxy resins with one aromatic group and one or two epoxy groups are, p-t-butylphenylglycidylether,
phenylglycidylether,
cresylglycidylether, and
the diglycidylether of resorcinol.

Mixtures of aliphatic and aromatic liquid epoxy resins can be used as well.

The first component can comprise about 30 wt. % to about 70 wt. % of the resin composition. Preferably, the amount of the solid epoxy resin(s) in the first component is about 10 wt. % to about 40 wt. %, and more preferably, about 15 wt. % to about 35 wt. %. Preferably, the amount of the liquid epoxy resin(s) in the first component is about 10 to about 40 wt. %.

The second component of the resin composition is a multifunctional acrylate or a mixture of such acrylates. This multifunctional acrylate preferably has two or more acrylate or methacrylate functional groups, in particular acrylate groups are preferred because of the improved cure speed obtained therewith. The multifunctional acrylate preferably has less than 8 acrylate groups per molecule. In particular, the number of functional groups is about 2 to about 5. Particularly useful compositions have been obtained using about 15 wt. % to about 35 wt. % of component b.

The resin composition may also comprise up to about 10 wt. % of a monofunctional acrylate functional diluent (which is different than component c). Preferred acrylates are aliphatic acrylates. Suitable acrylate functional compounds are acrylate esters of aliphatic (poly)hydroxy compounds. In general, the molecular weight of the acrylate functional compounds is between about 100 and about 2,000. Preferably, the molecular weight is lower than about 1,000.

Suitable acrylate functional compounds include, but are not limited to, trimethylolpropane triacrylate, the triacrylate or methacrylate from hexane-2,4,6 triol, or from glycerol, ethoxylated glycerol, or propoxylated glycerol,
hexanediol diacrylate,
1,3-butylene glycol diacrylate,
neopentyl glycol diacrylate,
1,6-hexanediol diacrylate,
neopentyl glycol diacrylate,
polyethylene glycol-200 diacrylate,
tetraethylene glycol diacrylate,
triethylene glycol diacrylate,
pentaerythritol tetraacrylate,
tripropylene glycol diacrylate,
ethoxylated bisphenol-A diacrylate,
trimetylolpropane diacrylate,
di-trimethylolpropane tetraacrylate,
triacrylate of tris(hydroxyethyl) isocyanurate,
dipentaerythritol hydroxypentaacrylate,
pentaerythritoltriacrylate,
ethoxylated trimethylolpropane triacrylate,
triethylene glycol dimethacrylate,
ethylene glycol dimethacrylate,
tetraethylene glycol dimethacrylate,
polyethylene glycol-2000 dimethacrylate,
1,6-hexanediol dimethacrylate,
neopentyl glycol dimethacrylate,
polyethylene glycol-600 dimethacrylate,
1,3-butylene glycol dimethacrylate,
ethoxylated bisphenol-A dimethacrylate,
trimethylolpropane trimethacrylate,
diethylene glycol dimethacrylate,
1,4-butanediol diacrylate,
diethylene glycol dimethacrylate,
pentaerythritol tetramethacrylate,
glycerin dimethacrylate,
trimethylolpropane dimethacrylate,
pentaerythritol trimethacrylate,
pentaerythritol dimethacrylate,
pentaerythritol diacrylate, and
the like and mixtures thereof.
Mono(meth)acrylates such as
cyclohexyl(meth)acrylate,
isobornyl(meth)acrylate,
lauryl(meth)acrylate,
alkoxylated phenolacrylate,
isooctyl-acrylate,
2-ethylhexyl-acrylate, and
tetrahydrofurfuryl(meth)-acrylate are operable, as reactive diluents.

The third component of the resin composition is a hydroxy functional compound. Excluded from the third component group are epoxy resins comprising hydroxy groups, which are included in the first component group. Particularly preferred is the use of an amount between about 10 and about 20 wt. %.

The hydroxyl groups react with the epoxy groups, and this hydroxyl functional compound generally is used to make the cured resins more flexible. This compound preferably is multifunctional and has in a particularly preferred embodiment 2–5 functional groups. The hydroxyl functional compound in general will have a molecular weight higher than about 100 but lower than about 2,000. Preferably, the molecular weight is lower than about 1,000.

Suitable hydroxyl functional compounds are for instance simple multifunctional alcohols, polyether-alcohols, and/or polyesters. Suitable examples of multifunctional alcohols are,
trimethylolpropane,
trimethylolethane,
pentaeritritol,
di-pentaeritritol,
glycerol,
bisphenol-A,
1,4-hexanediol,
1,4-hexanedimethanol and the like.

Suitable hydroxyfuntional polyetheralcohols are, for example, alkoxylated trimethylolpropane, alkoxylated bisphenol-A, in particular the
ethoxylated or propoxylated compounds, polyethyleneglycol-200 or -600 and the like.

Suitable polyesters include, hydroxyfunctional polyesters from diacids and diols with optionally small amounts of higher functional acids or alcohols. Suitable diols are those described above. Suitable diacids are, for example,
adipic acid, phthalic acid, isophthalic acid, dimer acid, hexahydrophthalic acid, 1,4-cyclohexane dicarboxylic acid and the like. Other suitable ester compounds include caprolactone based oligo- and polyesters such as the trimethylolpropane-triester with caprolactone, Tone®301 and Tone®310 (Union Carbide Chemical and Plastics Co., or UCCPC). The ester based polyols preferably have a hydroxyl number higher than about 50, in particular higher than about 100. The acid number preferably is lower than about 10, in particular lower than about 5.

Particularly preferred as the hydroxyl functional compound is a hydroxyl functional ester or ether compound with an ethylenically unsaturated group such as a vinylether group, allyl group or, most preferred, a (meth)acrylate group. The use of a compound with both at least one hydroxygroup and at least one -radically-polymerizable group improves the mechanical properties of the cured resin even further. Polycaprolactone based oligo- or polyesters appear to be very suitable compounds for use in the present inventions. Examples of suitable compounds are Tone® M100 (UCCPC), polyethylene glycol mono(meth)acrylate, pentaeritritol mono acrylate and the like.

The fourth component is a photosensitive cation generation compound. Cationic photoinitiators are known in the art. Particularly, a group of onium double salts which can generate Lewis acids capable of initiating polymerization by the irradiation are preferred.

Representative examples of the onium double salts include those represented by the general formula:

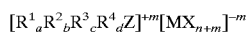

$$[R^1{}_a R^2{}_b R^3{}_c R^4{}_d Z]^{+m}[MX_{n+m}]^{-m}$$

wherein the cation is an onium;
Z is S, Se, Te, P, As, Sb, Bi, O, halogen (such as I, Br or Cl) or N≡N;
$R^1$ $R^2$ $R^3$ and $R^4$ may be the same or different from each other and are each an organic group;
a, b, c and d are each an integer of 0 to about 3 with the proviso that the sum total of a, b, c and d is equal to the normal valence number of Z plus m (for example, for a triarylsulfonium ion, $Ar_3S^+$, the normal valence of sulfur is 2;

M is a central atom of the halide complex and is a metal or metalloid such as B, P, As, Sb, Fe, Sn, Bi, Al, Ca, In, Ti, Zn, Sc, V, Cr, Mn or Co;

X is a halogen atom;

m is the net charge of the halide complex ion (generally m=1 for onium salts), and n is the number of halogen atoms in the neutral compound with M (for example, $BF_3$ is neutral and the anion used in the salt is $BF_4^-$).

Particular examples of the anion $MX^{n+m}$ of the above general formula include, tetrafluoroborate ($BF4^-$), hexafluorophosphate ($PF_6^-$), hexafluoroantimonate ($SbF^{6-}$)

hexafluoroarsenate ($AsF^{6-}$), and hexachloroantimonate ($SbCl^{6-}$).

Also, tetra(pentafluorophenyl)borate ($B(C^6F_5)_4^-$) can be used as a salt complex.

Particular preferred examples for Z are S or I (sulphonium or iodonium), the sulphonium being the presently most preferred.

Further, anions of the general formula: $MX_n(OH)^-$ can be used. Other anions which can be used according to the present invention include, perchlorate ion ($ClO_4^-$), trifluoromethyl sulfite ion ($CF_3SO_3^-$), fluorosulfonate ion ($FSO^{3-}$), toluenesulfonate anion, and trinitrobenzenesulfonate anion.

Particularly preferred as cationic catalyst are triaryl sulphonium salts.

The fifth component of the resin composition is a photosensitive radical generating compound or mixture of compounds. These photoinitiators are known in the art. Suitable photoinitiators include, but are not limited to, benzoin, benzil, benzilmethylketal, cyclohexylbenzilketal like Irgacure 184, benzildimethylketal, and the benzoin alkyl ethers, such as benzoin methyl ether, benzoin ether, benzoin isopropyl ether and benzoin isobutyl ether.

Another class of photoinitiators are the dialkoxyacetophenones exemplified by, 2,2-dimethoxy-2-phenylacetophenone, i.e.

Irgacure®651 (Ciba-Geigy), 2,2-diethoxy-2-phenylacetophenone, benzophenone, acetophenone, o-methoxybenzophenone, acenaphthene-quinone, methyl ethyl ketone, valerophenone, hexanophenone, alpha-phenyl-butyrophenone, p-morpholinopropiophenone, dibenzosuberone, 4-morpholinobenzophenone, 4"-morpholinodeoxybenzoin, p-diacetylbenzene, 4-aminobenzophenone, 4"-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphtahaldehyde, 4,4"-bis(dimethylamino)-benzophnone, fluorene-9-one, 1"acetonaphthone, 2"-acetonaphthone, 2,3-butanedione, acetonaphthene, benz[a]anthracene 7,12 diene, etc. Phosphine oxide photoinitiators can be used. The above initiators and sensitizing compounds can be used in combination as desired.

Further suitable sensitizing compounds are for example phosphines, such as for instance triphenylphosphine and tri-p-tolyl-phosphine.

Each of the cationic cure catalyst and the radical cure catalyst can be used in amounts of about 1 to about 6 wt. %. It is preferred that both catalysts be used in such amount that the photoefficiency is substantial equal, or that the absorption efficiency is substantially equal. In this way, both the radical and cationic cure have substantially the same rate of initiation of the reaction. Preferred amounts are about 1.5 to about 5 wt. % of both initiator compounds.

Although UV-curing is preferred, as the photosensitive compositions are exposed to visible light easily, visible light curable photosensitive compositions have the same advantages. In particular, laser curing can be suitably be performed with visible light-lasers. In that case, the photoinitiator system has to be adapted with the use of suitable sensitizers and/or initiators to give good cure at wavelength of about 400 to about 600 nm.

The composition may further comprise stabilizers in a range of about 0 to about 3% by weight, preferably 0.1 to about 1 % by weight. Suitable stabilizers are preferably (hindered) phenols, such as for example 2,6-di-tert-butyl-4-methylphenol and 4-methoxyphenol.

The composition according to the invention may further comprise minor amounts of additional additives such as for example surfactants, dyes, pigments and/or fillers.

The invention is also related to a process for the manufacture of 3-dimensional objects, using the above described resin composition. In particular, the process comprises manufacturing a 3-dimensional object by applying actinic radiation to a layer of photosensitive resin in order to cure a well-defined area of the resin layer. The irradiated area forms a cross section of the object. Next a fresh layer of resin is introduced on top of the cured layer and the curing step is repeated.

A number of ways are known to accomplish the irradiation of a well defined area. One of such methods comprises using a laser and use the focused laser light to cure the resin, such as described in U.S. Pat. No. 4,575,330 and GB-A-2262817. The use of the resin composition according to the present invention in such processes of this type is advantageous because of the resulting very good mechanical properties, both green strength and as post cured material.

The resin composition according to the invention is preferably used with a rapid prototyping process involving the use of a photomask to build objects. Such a method is, for instance, described in U.S. Pat. No. 5,519,816 which is incorporated herein by reference. In that method, a high power UV lamp is used to flood-expose one layer of a liquid photopolymer at a time through a negative, or mask. The mask is generated electrostatically on a glass plate with a toner powder. A 2 to about 20 second exposure from the lamp will usually be sufficient to solidify a thin surface layer of a photopolymer. The exposed mask is physically wiped clean and electrostatically discharged to prepare it for the next cross-section image. At the same time, the uncured photopolymer, which is still liquid, is blown (air-knifed), vacuumed or washed away. The cavities left by the uncured polymer are filled with hot wax. The wax solidifies to form a support structure for the next layer. Finally, the entire surface is milled with a cutter to make it ready for the next polymer layer. The cycle is repeated, so that the object is built up layer by layer. The resin composition according to the present invention is advantageously used in such a process, not only because of the very good mechanical properties, but also because the resin has the capability of achieving good through cure (no phase-separation on cure), with sharp cured-uncured boundaries, and very little photomask contamination.

The liquid epoxy resin, together with the liquid acrylate compounds can be used to adjust the viscosity of the prec-cured composition to a suitable range. In particular, the viscosity of the photosensitive resin composition can be between about 100 mPa.s and about 3000 mPa.s, measured at the application temperature. For laser-cured rapid-prototyping processes, the viscosity preferably is between about 100 mPa.s to about 500 mPa.s, whereas the viscosity for processes that uses a photo-mask, the viscosity preferably is between about 1,000 mPa.s to about 3,000 mPa.s at the application temperature. The application temperature can be varied according to selected components of the resin composition and the other parameters used in the process. Preferably the application temperature can be between about 25° C. to about 40° C. and more preferrably between about about 30° C. to about 32° C.

The resin composition of the present invention exhibits good mechanical properties upon cure. In particular, it is possible to achieve upon full cure a film of about 75 μm thickness having a secant modulus of higher than about 1,000 MPa (at 2.5 % elongation), and an elongation above about 5%, and preferably higher than about 8%.

The invention will be further described with the following examples, which are provided for the purpose of illustrating the practice of the invention, and which are not intended to limit the invention nor the scope of the claims.

EXAMPLES I–IV

The components as listed in table 1, except for the initiators, were mixed (the amounts in wt. %) carefully at 70° C. for about 3 hours until the mixture was homogeneous. The mixture was then cooled and the initiators were added and mixed in.

TABLE 1

| Component | Description | I | II | III | IV |
|---|---|---|---|---|---|
| EPON 1001F[1] | Solid Bisphenol-A epoxy resin | 25 | 27.5 | 25 | 17.5 |
| EPON 828[1] | Liquid Bisphenol-A epoxy resin | 23 | 10 | 25 | 40 |
| SR 454[2] | ethoxylated trimethylolpropane triacrylate | 28 | 47.5 | 20 | 28 |
| Tone M100[3] | caprolactoneacrylate | 20 | | 25 | 10 |
| Tone 301[3] | caprolactonetriol | | 10 | | |
| UVI 6974[3] | cationic initiator | 2 | 2.5 | 2.5 | 2 |
| Irgacure 184[4] | Free-radical initiator | 2 | 2.5 | 2.5 | 2.5 |
| Calculated Ratio | weight ratio of epoxy compounds to acrylate compounds | 1.00 | 0.79 | 1.11 | 1.51 |

[1]Shell Chemical
[2]Sartomer
[3]UCCPC
[4]Ciba-Geigy

The viscosity of each of the resin mixtures was measured at 32° C., and reported in Table 2. The cure depth and rosette for each resin mixture was measured using a 10 sec. exposure with a total energy of 0.09 Joules/cm$^2$ from a Fusion D bulb. The rosette value defines the level of optical density just below that which will cause gel formation. Preferably, for the type of rapid prototyping processes that use a photomask, the rosette value is between about 40% and about 60%, at the exposure energy level employed.

Furthermore, a 75 μm thick film was drawn on a glass film, and cured by exposure to 2 J/cm$^2$ of UV light. Next, the film was post-cured for 1 hr. at 88° C.

From the cured film the mechanical properties were measured. The results are shown in Table 2.

TABLE 2

| Characteristic | I | II | III | IV |
|---|---|---|---|---|
| viscosity (mPa · s) | 1735 | 2081 | 1730 | 1440 |
| cure depth (μm) | 309 | 493 | 267 | 333 |
| Rosette value (%) | 35 | 50 | 40 | 40 |
| Tensile strength (MPa) | 54 | 54 | 48 | 65 |
| Elongation (%) | 6 | 5 | 16 | 3 |
| Modulus (MPa)[1)] | 1568 | 1668 | 1550 | 2230 |
| Tg (° C.) | | | 63 | 96 |

[1)]Secant modulus, measured at 2.5% elongation.

Further, if cured through a photomask, the resins compositions exhibited a substantially homogeneous cure, whereas, by contrast, a composition with a cycloaliphatic epoxy resin (non-aromatic) suffered from an uncured resin layer at the bottom of a cured film.

EXAMPLES V–IX

Further, several resin mixtures were prepared and tested in an analogous way to Examples I–IV. The components are shown in Table 3, and the results in Table 4.

TABLE 3

| Component | Description | V | VI | VII | VIII | IX |
|---|---|---|---|---|---|---|
| EPON 1001F | solid bisphenol-A epoxy resin | 32.5 | 30.5 | 23.7 | 27.0 | 30.3 |

TABLE 3-continued

| Component | Description | V | VI | VII | VIII | IX |
|---|---|---|---|---|---|---|
| UVR 6105[1] | liquid cyclo-aliphatic epoxy resin | 17.0 | 19.0 | — | — | 19.0 |
| UVR 6128[2] | liquid cyclo-aliphatic epoxy resin | — | — | 14.2 | 22.5 | — |
| Photomer 3016 | epoxy acrylate | — | — | 11.4 | — | — |
| Tone M100 | capro-lactone acrylate | 22.5 | 20.0 | 14.2 | 13.0 | 25.0 |
| SR 454[3] | tri-acrylate[3] | 22.5 | — | 31.3 | 32.0 | 20.0 |
| SR 499[4] | tri-acrylate[4] | — | 25.0 | — | — | — |
| UVI 6974 | cationic photoinitiator | 2.5 | 2.5 | 2.4 | 2.5 | 2.5 |
| Irgacure 184 | free radical photo-initiator | 3.0 | 3.0 | 2.8 | 3.0 | 3.2 |
| Calculated Ratio | weight ratio of epoxy compounds to acrylate compounds | 1.10 | 1.10 | 0.87 | 1.10 | 1.10 |

[1]3,4-epoxycyclohexylmethyl-3,4-epoxycyclohexane carboxylate
[2]bis((3,4-epoxycyclohexyl)adipate
[3]SR454 ethoxylated trimethylolpropane-triacrylate (ethoxylation degree = 3)
[4]SR499 ethoxylated trimethylolpropane triacrylate (ethoxylation degree = 6)

TABLE 4

| Property | V | VI | VII | VIII | IX |
|---|---|---|---|---|---|
| viscosity (mPa · s) | 1825 | 1620 | 1670 | 1378 | 1531 |
| cure depth (µm) | 394 | 604 | — | — | — |
| rosette value (%) | 50 | 55 | — | — | — |
| tensile strength (MPa) | 52 | 43 | 53 | 54 | 55 |
| elongation (%) | 7 | 29 | 7 | 8 | 8 |
| secant modulus (MPa) | 1569 | 1261 | 1100 | 1170 | 1290 |

While the invention has been described in detail and with reference to specific embodiments thereof, it will be apparent to those of ordinary skill in the art that various changes and modifications can be made therein without departing from the spirit and scope thereof.

What is claimed is:

1. A process for manufacturing a 3-dimensional object comprising:
   applying radiation to an uncured first layer of photosensitive resin composition in order to cure a predetermined area of said first layer,
   thereafter introducing an uncured second layer of said photosensitive resin composition on top of said first layer and applying radiation to cure a predetermined area of said uncured second layer,
   wherein said photosensitive resin composition comprises
   (i) at least one acrylate compound;
   (ii) at least one epoxy compound which is solid at room temperature;
   (iii) at least one epoxy compound which is liquid at room temperature;
   (iv) at least one cationic photoinitiator; and
   (v) at least one free radical photoinitiator;
   wherein the weight ratio of epoxy compounds to acrylate compounds in said composition is from 0.79 to 1.51.

2. The process of claim 1, wherein said composition comprises from about 30 wt. % to about 70 wt. % of epoxy compounds.

3. The process of claim 1, wherein said composition comprises from about 15 wt. % to about 50 wt. % of at least one multifunctional acrylate compound.

4. The process of claim 3, wherein said at least one multifunctional acrylate compound comprises from 2 to 5 acrylate groups.

5. The process of claim 1, wherein said composition comprises, relative to the total weight of the composition from about 5 wt. % to about 30 wt. % of at least one hydroxyftnctional compound.

6. The process of claim 5, wherein said hydroxyfunctional compound comprises from 2 to 5 hydroxy groups.

7. The process of claim 5, wherein said hydroxyfunctional compound comprises at least one ethylenically unsaturated group.

8. The process of claim 7, wherein said ethylenic unsaturation is methacrylate or acrylate.

9. The process of claim 1, wherein said composition comprises, relative to the total weight of the composition, from about 1 wt. % to about 6 wt. % of said at least one cationic photoinitiator.

10. The process of claim 1, wherein said composition comprises, relative to the total weight of the composition, from about 1 wt. % to about 6 wt. % of said at least one free radical photoinitiator.

11. The process of claim 1, wherein said composition comprises, relative to the total weight of the composition from about 15 wt. % to about 35 wt. % of said at least one solid epoxy compound, and from about 10 wt. % to about 40 wt % of said at least one liquid epoxy compound.

12. The process of claim 1, wherein said at least one liquid epoxy compound comprises a cycloaliphatic group.

13. The process of claim 1, wherein said at least one liquid epoxy compound comprises an aromatic group.

14. The process of claim 1, wherein said cationic photoinitiator is a triarylsulfonium salt.

15. The process of claim 1, wherein the predetermined area of said first layer and the predetermined area of said second layer are cured with a laser beam, said laser beam being motion controlled with a computer so as to have said laser beam scanned over said predetermined areas in order to initiate said curing.

* * * * *